United States Patent
Hsu et al.

(10) Patent No.: US 12,494,437 B2
(45) Date of Patent: Dec. 9, 2025

(54) SUBSTRATE STRUCTURE INCLUDING DIFFERENT SIZE OF ELECTRONIC COMPONENT

(71) Applicant: Advanced Semiconductor Engineering, Inc., Kaohsiung (TW)

(72) Inventors: Wu Chou Hsu, Kaohsiung (TW); Min-Yao Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 670 days.

(21) Appl. No.: 17/752,793

(22) Filed: May 24, 2022

(65) Prior Publication Data

US 2022/0285282 A1    Sep. 8, 2022

Related U.S. Application Data

(63) Continuation of application No. 16/899,517, filed on Jun. 11, 2020, now Pat. No. 11,342,272.

(51) Int. Cl.
| | |
|---|---|
| *H01L 23/538* | (2006.01) |
| *H01L 21/48* | (2006.01) |
| *H01L 23/00* | (2006.01) |
| *H01L 23/31* | (2006.01) |

(52) U.S. Cl.
CPC ...... *H01L 23/5389* (2013.01); *H01L 21/4857* (2013.01); *H01L 23/3128* (2013.01);
(Continued)

(58) Field of Classification Search
CPC ............ H01L 23/5389; H01L 21/4857; H01L 23/3128; H01L 23/5383; H01L 23/5386; H01L 24/16; H01L 2224/16227; H01L 2924/19103; H01L 25/0652; H01L 25/50; H01L 23/13; H01L 23/5384; H01L 23/64;
(Continued)

(56) References Cited

U.S. PATENT DOCUMENTS

| | | | |
|---|---|---|---|
| 9,406,658 B2 | 8/2016 | Lee et al. | |
| 9,633,977 B1* | 4/2017 | We | H01L 23/5387 |

(Continued)

OTHER PUBLICATIONS

Non-Final Office Action for U.S. Appl. No. 16/899,517, issued Sep. 28, 2021, 11 pages.

(Continued)

*Primary Examiner* — Eliseo Ramos Feliciano
*Assistant Examiner* — Sophia W Kao
(74) *Attorney, Agent, or Firm* — FOLEY & LARDNER LLP

(57) ABSTRACT

A substrate structure, a method for manufacturing the same and a semiconductor package structure including the same are provided. The substrate structure includes a substrate, a first electronic component, a second electronic component and a plurality of metal layers. The first electronic component is disposed within the substrate. The second electronic component is disposed within the substrate and arranged in a horizontal direction with the first electronic component. The metal layers are disposed above an upper surface of the substrate. The number of metal layers above the first electronic component is greater than the number of metal layers above the second electronic component.

6 Claims, 11 Drawing Sheets

(52) U.S. Cl.
CPC ...... *H01L 23/5383* (2013.01); *H01L 23/5386* (2013.01); *H01L 24/16* (2013.01); *H01L 2224/16227* (2013.01); *H01L 2924/19103* (2013.01)

(58) Field of Classification Search
CPC ......... H01L 24/24; H01L 24/82; H01L 25/16; H01L 23/49816; H01L 24/13; H01L 24/32; H01L 24/73; H01L 24/81; H01L 2224/13101; H01L 2224/13139; H01L 2224/16225; H01L 2224/24155; H01L 2224/2518; H01L 2224/73204; H01L 2224/81801; H01L 2924/1433; H01L 2924/15311; H01L 2924/15321; H01L 2924/181; H01L 2924/18161; H01L 24/25; H01L 2221/68345; H01L 21/6835; H01L 21/4846; H01L 21/50; H01L 23/3157; H01L 23/49838
See application file for complete search history.

(56) References Cited

U.S. PATENT DOCUMENTS

| | | | |
|---|---|---|---|
| 9,807,885 B2 | 10/2017 | Sakai et al. | |
| 2008/0157316 A1 | 7/2008 | Yang | |
| 2012/0212919 A1* | 8/2012 | Mano | H05K 1/185 174/258 |
| 2014/0285213 A1* | 9/2014 | Sakurai | H05K 1/0268 174/251 |
| 2014/0360765 A1* | 12/2014 | Kiwanami | H05K 1/185 174/260 |
| 2016/0316566 A1* | 10/2016 | Sakai | H05K 3/4644 |
| 2017/0064837 A1* | 3/2017 | Li | H01L 21/4857 |
| 2020/0212020 A1* | 7/2020 | Zhang | H01L 23/528 |

OTHER PUBLICATIONS

Notice of Allowance for U.S. Appl. No. 16/899,517, issued Jan. 28, 2022, 7 pages.

* cited by examiner

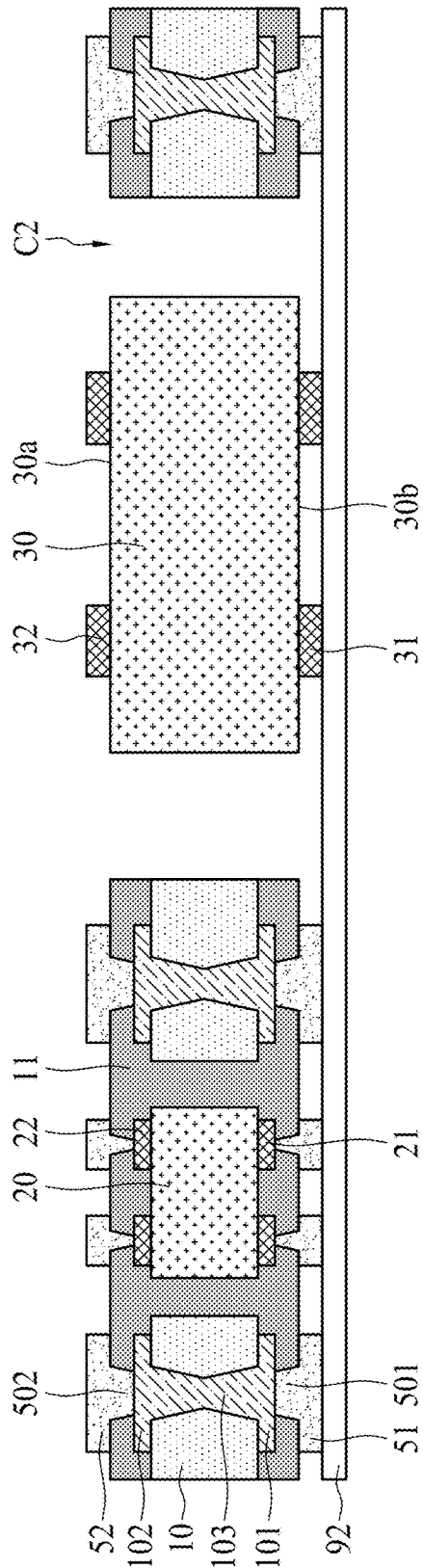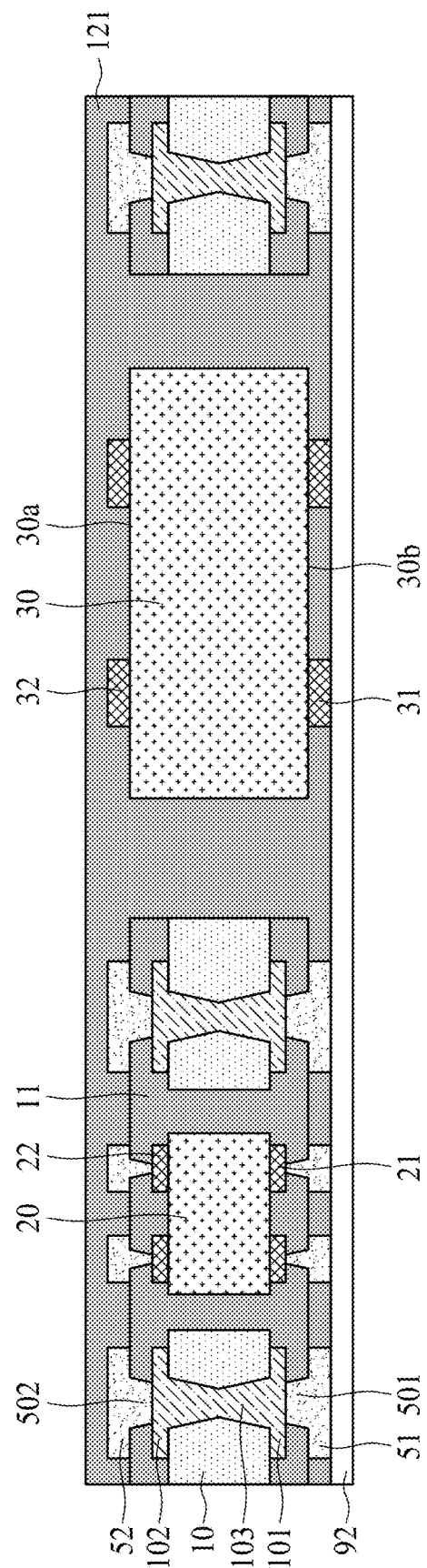
FIG. 4I
FIG. 4J

SUBSTRATE STRUCTURE INCLUDING DIFFERENT SIZE OF ELECTRONIC COMPONENT

CROSS-REFERENCE TO RELATED APPLICATION

This application is a continuation of U.S. patent application Ser. No. 16/899,517 filed Jun. 11, 2020, now issued as U.S. Pat. No. 11,342,272, the contents of which is incorporated herein by reference in its entirety.

BACKGROUND

1. Field of the Disclosure

The present disclosure relates to a substrate structure, and particularly to a substrate structure including different sizes of electronic components.

2. Description of the Related Art

The ever-increasing sophistication of smart systems raises the importance of the integration of ICs. One of the main approaches to manufacturing a semiconductor package structure with a smaller size is to embed active devices and passive devices into a substrate. With such embedded substrate, conductive paths can be reduced, and thus power loss can be reduced.

However, when electronic components of different sizes are embedded, vias with greater aspect ratio may be needed, which increases the difficulty in the manufacturing processes, such as laser drilling or electroplating. In addition, terminals on two opposing sides of the electronic component may lie at different distances to an adjacent surface of the substrate and have different diameters, which negatively impacts design of the layout of the semiconductor package structure and is disadvantageous to impedance matching.

SUMMARY

In some embodiments, a substrate structure includes a substrate, a first electronic component, a second electronic component and a plurality of metal layers. The first electronic component is disposed within the substrate. The second electronic component is disposed within the substrate and arranged in a horizontal direction with the first electronic component. The metal layers are disposed above an upper surface of the substrate. The number of metal layers above the first electronic component is greater than the number of metal layers above the second electronic component.

In some embodiments, a semiconductor package structure includes a substrate structure, a first redistribution structure, a first semiconductor die and an encapsulant. The substrate structure includes a substrate, a first electronic component and a second electronic component. The first electronic component is disposed within the substrate. The second electronic component is disposed within the substrate and arranged in a horizontal direction with the first electronic component. A thickness of the first electronic component is less than a thickness of the second electronic component. The first redistribution structure is disposed on an upper surface of the substrate structure. The first semiconductor die is disposed on the first redistribution structure. The encapsulant covers the first semiconductor die and the first redistribution structure.

In some embodiments, a method for manufacturing a substrate structure includes: providing a core substrate having a first cavity; disposing a first electronic component in the first cavity; forming a first metal layer covering and electrically connected to the first electronic component; forming a second cavity penetrating through the core substrate; disposing a second electronic component in the second cavity; and forming a second metal layer covering and electrically connected to the first electronic component and the second electronic component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M illustrate various stages of an example of a method for manufacturing a substrate structure according to some embodiments of the present disclosure.

DETAILED DESCRIPTION

Figure 1:
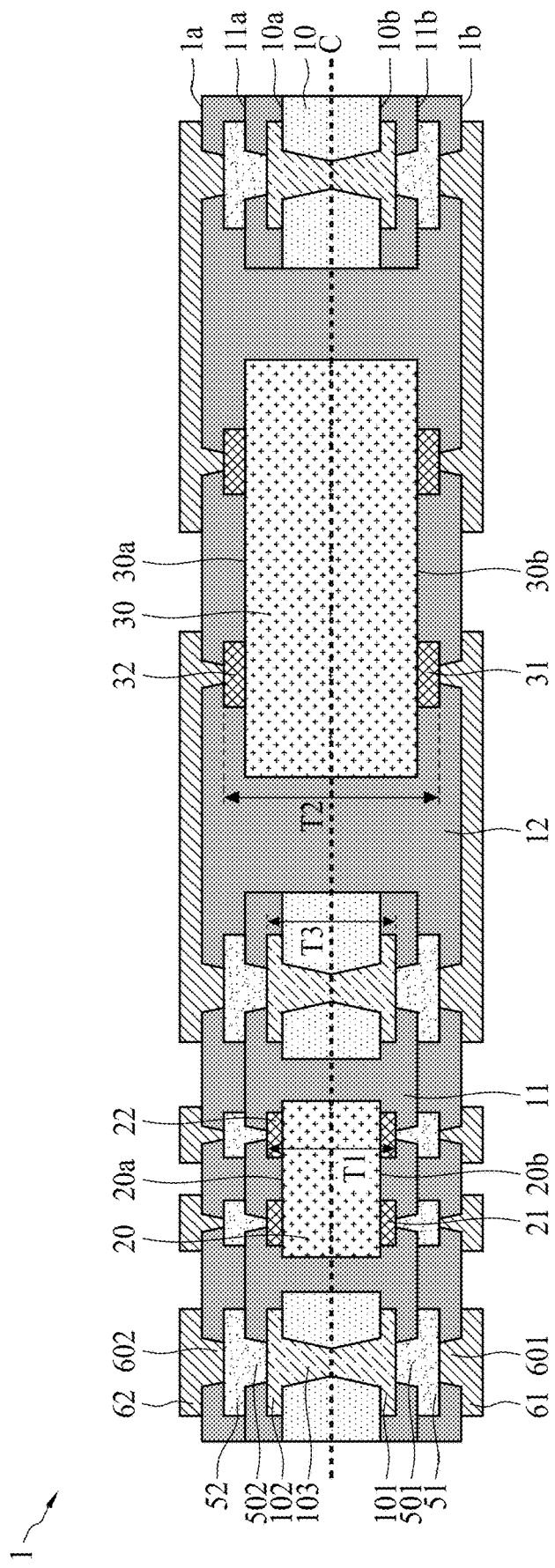
FIG. 1 illustrates a cross-sectional view of an example of a substrate structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
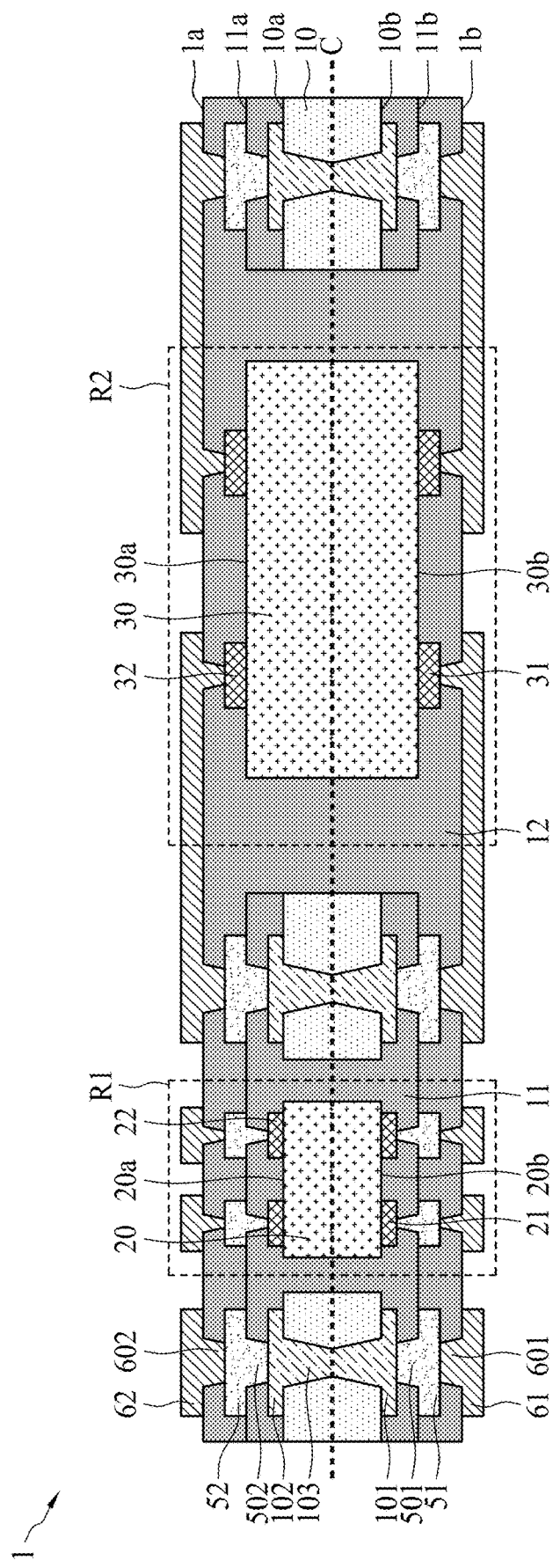
FIG. 1A illustrates a cross-sectional view of an example of a substrate structure according to some embodiments of the present disclosure.

FIG. 1 and FIG. 1A illustrate a cross-sectional view of an example of a substrate structure 1 according to some embodiments of the present disclosure.

The substrate structure 1 includes a substrate 10, an electronic component 20, an electronic component 30, a dielectric layer 11, a dielectric layer 12 and a plurality of metal layers, such as a metal layer 51, a metal layer 52, a metal layer 61 and a metal layer 62.

The substrate 10 may include a core substrate. The core substrate may include Prepreg (PP), Ajinomoto build-up film (ABF) or other suitable materials. In some embodiments, a resin material used in the core substrate may be a fiber-reinforced resin so as to strengthen the core substrate, and the reinforcing fibers may be, without limitation to, glass fibers or Kevlar fibers (aramid fibers). The substrate 10 defines a plurality of cavities for accommodating electronic components with different sizes. The substrate 10 may include conductive trace(s), pad(s), contact(s), via(s) for electrical connection. For example, in the embodiments illustrated in FIG. 1, the substrate 10 may include a pad 101, a pad 102 and a via 103. The pad 102 is disposed on an upper surface 10a of the substrate 10 and the pad 102 is disposed on a lower surface 10b of the substrate 10. The via 103 penetrates through the substrate 10 and connects the pad 101 and the pad 102.

The electronic component 20 is disposed within the substrate 10. The electronic component 20 is disposed in a first cavity defined by the substrate 10. The electronic component 20 may include a passive device, an active device or both. In some embodiments, the electronic component 20 may be an integrated passive device (IPD). The passive device may include an inductor, a capacitor or other passive device. The active device may include a diode, a transistor or other active devices. The electronic component 20 may also be referred to as the first electronic component.

The electronic component 20 has a surface 20a and a surface 20b opposite to the surface 20a. The surface 20b may also be referred to as the lower surface. The surface 20a may also be referred to as the upper surface. The electronic component 20 may include a terminal 22 and a terminal 21 on the surface 20a and the surface 20b, respectively. The terminal 22 and the terminal 21 may include conductive materials, such as metal, metal alloy or other suitable materials.

The dielectric layer 11 encloses or covers the substrate 10 and the electronic component 20. The electronic component 20 is embedded in the dielectric layer 11. In some embodiments, the dielectric layer 11 covers the surface 10a and the surface 10b of the substrate 10 and fills the first cavity defined by the substrate 10. The dielectric layer 11 may be made of a polymeric or a non-polymeric dielectric material. In some embodiments, the dielectric layer 11 may include a flowable dielectric material in a hardened or semi-hardened state, such as a liquid crystal polymer, a resin with pre-impregnated fibers, Ajinomoto Buildup Film (ABF), an epoxy resin, polyimide, molding compound or other flowable dielectric material in a hardened or semi-hardened state. The dielectric layer 11 defines a second cavity together with the substrate 10 for accommodating the electronic component 30. The second cavity is different from the first cavity.

The electronic component 30 is disposed within the substrate 10. The electronic component 30 is disposed in a second cavity defined by the substrate 10 and the dielectric layer 11. The electronic component 30 may be separated from the electronic component 20 by the substrate 10. The electronic component 30 and the electronic component 20 may be arranged side-by-side or along a horizontal direction. The electronic component 30 may be embedded in the dielectric layer 12. The electronic component 30 may include a passive device, an active device or both. In some embodiments, the electronic component 30 may be an IPD. The passive device may include an inductor, a capacitor or other passive device. The active device may include a diode, a transistor or other active devices. The electronic component 30 may have a size different from that of the electronic component 20. In some embodiments, the size of the electronic component 30 may be greater than that of the electronic component 20. The electronic component 30 may also be referred to as the second electronic component.

The electronic component 30 has a surface 30a and a surface 30b opposite to the surface 30a. The surface 30b may also be referred to as the lower surface. The surface 30a may also be referred to as the upper surface. The electronic component 30 may include a terminal 32 on the surface 30a and a terminal 31 on the surface 30b, respectively. The terminal 32 and the terminal 31 may include conductive materials, such as metal, metal alloy or other suitable materials.

In some embodiments, at least one of the electronic component 20 and the electronic component 30 is a passive device. In some embodiments, the electronic component 20 and the electronic component 30 are both passive devices.

The dielectric layer 12 encloses or covers the dielectric layer 11, the metal layers 51 and 52 and the electronic component 30. The electronic component 30 is embedded in the dielectric layer 12. In some embodiments, the dielectric layer 12 covers an upper surface 11a and a lower surface 11b of the dielectric layer 11, an upper surface of the metal 52 and an lower surface of the metal layer 51, and fills the second cavity defined by the substrate 10 and the dielectric layer 11. The dielectric layer 12 may be made of a polymeric or a non-polymeric dielectric material. In some embodiments, the dielectric layer 12 may include a flowable dielectric material in a hardened or semi-hardened state, such as a liquid crystal polymer, a resin with pre-impregnated fibers, Ajinomoto Buildup Film (ABF), an epoxy resin, polyimide, molding compound or other flowable dielectric material in a hardened or semi-hardened state.

The electronic component 20 has a thickness T1. The thickness T1 may refer to a vertical dimension of the electronic component 20. In some embodiment, the thickness T1 may refer to a distance from an upper surface to a lower surface of the electronic component 20 along a vertical direction. In the embodiments where terminals 21 and 22 are present as illustrated in FIG. 1, thickness T1 may refer to a distance from an upper surface of the terminal 22 to a lower surface of the terminal 21 along the vertical direction.

The electronic component 30 has a thickness T2. The thickness T2 may refer to a vertical dimension of the electronic component 30. In some embodiment, the thickness T2 may refer to a distance from an upper surface to a lower surface of the electronic component 30 along the vertical direction. In the embodiments where terminals 31 and 32 are present as illustrated in FIG. 1, the thickness T2 may refer to a distance from an upper surface of the terminal 32 to a lower surface of the terminal 31 along the vertical direction.

The substrate 10 has a thickness T3. The thickness T3 may refers to a vertical dimension of the substrate 10. In some embodiment, the thickness T3 may refer to a distance from an upper surface to a lower surface of the substrate 10 along the vertical direction. In the embodiments where pads are disposed on the upper surface and the lower surface of the substrate 10, the thickness T3 may refer to a distance from an upper surface of the pad 102 to a lower surface of the pad 101 along the vertical direction.

In some embodiments, the thickness T1 of the electronic component 20 is greater than, substantially equal to, or less than the thickness T3 of the substrate 10. In some embodiments, the thickness T1 of the electronic component 20 is substantially equal to or less than the thickness T3 of the substrate 10. In some embodiments, the thickness T1 of the electronic component 20 is substantially equal to the thickness T3 of the substrate 10.

In some embodiments, the thickness T1 of the electronic component 20 is less than the thickness T2 of the electronic component 30.

In some embodiments, the thickness T3 of the substrate 10 is less than the thickness T2 of the electronic component 30.

In some embodiments, the thickness T1 of the electronic component 20 is less than the thickness T2 of the electronic component 30; and the thickness T3 of the substrate 10 is less than the thickness T2 of the electronic component 30.

In some embodiments, the thickness T1 of the electronic component 20 is less than the thickness T2 of the electronic component 30, the thickness T3 of the substrate 10 is less than the thickness T2 of the electronic component 30, and the thickness T1 of the electronic component 20 is substantially equal to or less than the thickness T3 of the substrate 10.

In some embodiments, the lower surface 20b of the electronic component 20 is higher than the lower surface 30b of the electronic component 30. In some embodiments, the upper surface 20a of the electronic component 20 is lower than the upper surface 30a of the electronic component 30. In some embodiments, the lower surface 20b of the electronic component 20 is located within a distance between the surface 30b and the surface 30a of the electronic component 30. In some embodiments, the surface 20a of the electronic component 20 is located within a distance between the surface 30b and the surface 30a of the electronic component 30.

The substrate structure 1 includes a plurality of metal layers disposed above a surface of the substrate (e.g., the metal layers 52 and 62 above the surface 10a of the substrate 10 or the metal layers 51 and 61 above the surface 10b of the substrate 10). In some embodiments, the metal layers may has a portion (e.g., a pad) located directly above one or more of the electronic components with different sizes. In the embodiments according to the present disclosure, the number of metal layers disposed above or directly above a small electronic component is greater than the number of metal layers disposed above or directly above a larger electronic component. Therefore, the electrical connection from the small electronic component to the pad of the outmost metal layer can be achieved by two or more small vias, rather than a single via, which improves the aspect ratio of the vias and thus is advantageous to the yield and electrical performance of the substrate structure.

The metal layers 51, 52, 61 and 62 may include trace(s) and pad(s). The metal layers 51, 52, 61 and 62 may include metal, metal alloy or other suitable materials. The metal layers 52 and 62 are disposed above the surface 10a of the substrate 10. The metal layers 51 and 61 are disposed below the surface 10b of the substrate 10. The spatial descriptions are for purposes of illustration only.

The metal layer 51 may be disposed on the surface 11b of the dielectric layer 11. In some embodiments, the metal layer 51 may cover or be disposed below the substrate 10 and the electronic component 20. In some embodiments, the metal layer 51 may cover or be disposed below the surface 20b of the electronic component 20. The metal layer 51 may not cover or be disposed below the surface 30b of the electronic component 30. In some embodiments, the metal layer 51 may be coplanar with the terminal 31 of the electronic component 30. That is, the metal layer 51 may have an elevation substantially the same as that of the terminal 31 of the electronic component 30. More specifically, the lower surface of the metal layer 51 may have an elevation substantially the same as the lower surface of the terminal 31. The metal layer 51 may be electrically connected to pad 102 of the substrate 10 or the terminal 21 of the electronic component 20 through a via 501.

The metal layer 52 may be disposed on the surface 11a of the dielectric layer 11. In some embodiments, the metal layer 52 may cover or be disposed above the substrate 10 and the electronic component 20. In some embodiments, the metal layer 52 may cover or be disposed above the surface 20a of the electronic component 20. The metal layer 52 may not cover or be disposed above the surface 30a of the electronic component 30. In some embodiments, the metal layer 52 may be coplanar with the terminal 32 of the electronic component 30. That is, the metal layer 52 may have an elevation substantially the same as that of the terminal 32 of the electronic component 30. More specifically, the upper surface of the metal layer 52 may have an elevation substantially the same as the upper surface of the terminal 32 of the electronic component 30. The metal layer 52 may be electrically connected to the pad 102 of the substrate 10 or the terminal 22 of the electronic component 20 through a via 502.

The metal layer 61 may be disposed on the surface 12b of dielectric layer 12. In some embodiments, the metal layer 61 may cover or be disposed below the substrate 10, the metal layer 51, the electronic component 20 and the electronic component 30. In some embodiments, the metal layer 61 may cover or be disposed below the surface 20b of the electronic component 20. In some embodiments, the metal layer 61 may cover the surface 30b of the electronic component 30. The metal layer 61 may be electrically connected to the pad 101 of the substrate 10 or the terminal 21 of the electronic component 20 through a via 601, the metal layer 51 and the via 501. The metal layer 61 may be electrically connected to the terminal 31 of the electronic component 30 through the via 601. In some embodiments, the thickness of the metal layer 51 may be greater than that of the metal layer 61.

The metal layer 62 may be disposed on the surface 12a of dielectric layer 12. In some embodiments, the metal layer 62 may cover or be disposed above the substrate 10, the metal layer 52, the electronic component 20 and the electronic component 30. In some embodiments, the metal layer 62 may cover or be disposed above the surface 20a of the electronic component 20. In some embodiments, the metal layer 62 may cover or be disposed above the surface 30a of the electronic component 30. The metal layer 62 may be electrically connected to the pad 102 of the substrate 10 or the terminal 22 of the electronic component 20 through a via 602, the metal layer 52 and the via 502. The metal layer 62 may be electrically connected to the terminal 32 of the electronic component 30 through the via 602.

The thickness of the metal layers can be adjusted depending on the thickness of the electronic components (for example, the thickness of the metal layers 51 and 52 can be adjusted depending on the thickness of the electronic component 30). Therefore, the metal layers embedded within the substrate structure may have a thickness greater than the outmost metal layers. In some embodiments, the thickness of the metal layer 51 may be greater than that of the metal layer 61. In some embodiments, the thickness of the metal layer 52 may be greater than that of the metal layer 62.

In some embodiments, the number of metal layers positioned directly above (i.e., over) the electronic component 20 is greater than the number of metal layers positioned directly above (i.e., over) the electronic component 30. As shown in FIG. 1, the metal layer 52 and the metal layer 62 are positioned over the electronic component 20, while the metal layer 62 is positioned over the electronic component 30. In some embodiments, the number of metal layers over the electronic component 20 is equal to the number of metal layers over the substrate 10. As shown in FIG. 1, the metal layer 52 and the metal layer 62 are positioned over the electronic component 20 and the substrate 10.

The metal layer 51 or the metal layer 52 may also be referred to as the first metal layer or a first electroplating layer. The metal layer 61 or the metal layer 62 may also be referred to as the second metal layer or a second electroplating layer.

The substrate structure 1 may include an upper surface 1a and a lower surface 1b opposite to the upper surface. The lower surface 1b of the substrate structure 1 may be defined by the lower surface of the dielectric layer 12 or defined by the lower surface of the metal layer 61 (if present). The upper surface 1a may be defined by the upper surface of the dielectric layer 12 or the upper surface of the metal layer 62 (if present).

In some embodiments, a distance between the upper surface 20a of the electronic component 20 and the upper surface 1a of the substrate structure 1 is substantially equal to a distance between the lower surface 20b of the electronic component 20 and the surface 1b of the substrate structure 1. In some embodiments, a distance between the upper surface 30a of the electronic component 30 and the upper surface 1a of the substrate structure 1 is substantially equal to a distance between the surface 30b and the surface 1b of the substrate structure 1. In some embodiments, a distance between the pad 101 and the surface 1b is substantially equal to a distance between the pad 102 and the surface 1a.

In some embodiments, the horizontal central axis of the electronic component 20 is substantially coplanar with the horizontal central axis of the electronic component 30. In some embodiments, the substrate structure 1 includes an upper portion and a lower portion that are symmetric to each other with respect to the central axis C of the substrate structure 1. The central axis C may substantially coplanar with the horizontal central axis of the electronic component 20 or the horizontal central axis of the electronic component 30.

As shown in FIG. 1A, in some embodiments, the substrate structure 1 has a first portion R1 located at a vertical projection direction of the electronic component 20, and the first portion of the substrate structure 1 is symmetric with respect to the horizontal central axis of the electronic component 20. As shown in FIG. 1A, in some embodiments, the substrate structure 1 has a second portion R2 located at the vertical projection direction of the electronic component 30, and the second portion of the substrate structure 1 is symmetric with respect to the horizontal central axis of the electronic component 30. Due to the symmetry, the vias 601 and 602 may have substantially the same aperture or aspect ratio and the vias 501 and 502 may have substantially the same aperture or aspect ratio. Therefore, the process, such as laser drilling or electroplating, for forming the vias (e.g., 601 and 602, 501 and 502) may be optimized.

According to some embodiments of the present disclosure, the substrate structure includes two or more electronic components of different sizes. The horizontal central axis of the smaller electronic component is substantially coplanar with the horizontal central axis of the larger electronic component, which improves the impedance matching and/or the layout of the substrate structure. Moreover, the vias positioned above and below the larger electronic component at symmetrical positions may have substantially the same aperture or aspect ratio. For example, the aperture or aspect ratio of the via 602 directly above the electronic component 30 may substantially equal to that of the via 601 directly below the electronic component 30. Therefore, the process, such as laser drilling or electroplating, may be optimized, thereby enhancing the yield and electrical performance of the substrate structure.

Figure 2:
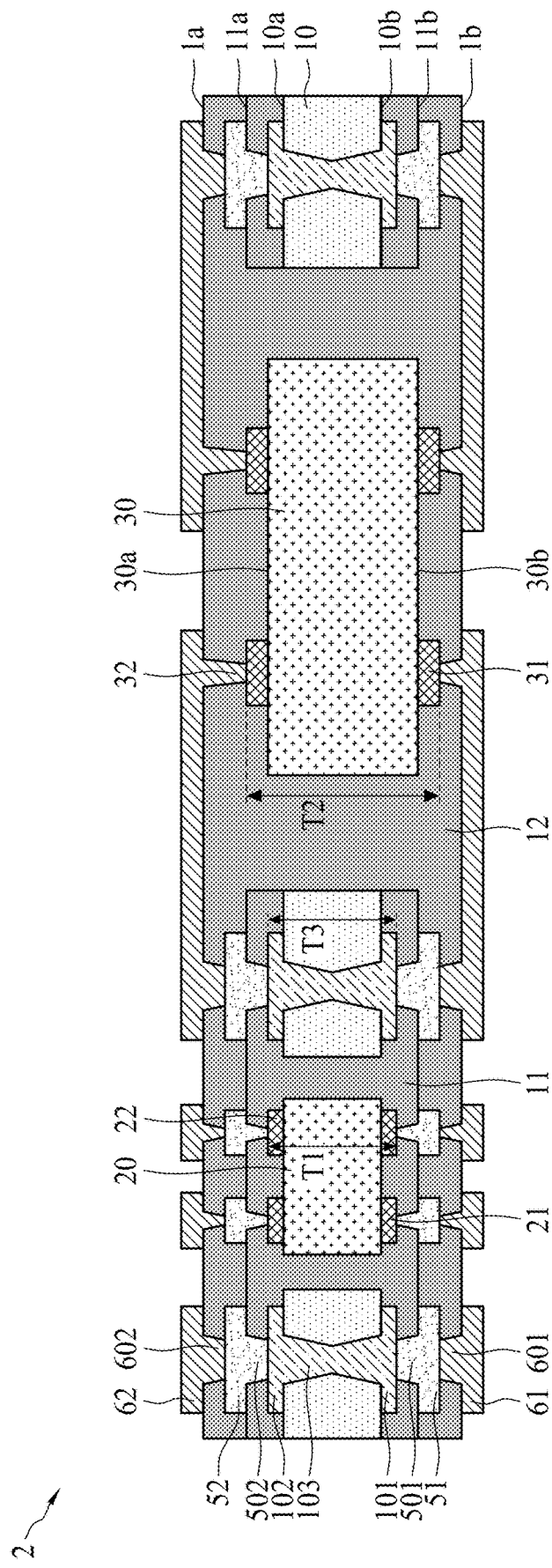
FIG. 2 illustrates a cross-sectional view of an example of a substrate structure according to some embodiments of the present disclosure.

FIG. 2 illustrates a cross-sectional view of an example of a substrate structure 2 according to some embodiments of the present disclosure. The substrate structure 2 of FIG. 2 has a structure similar to that of the substrate structure 1 of FIG. 1 with differences that the terminal 31 of the electronic component 30 is coplanar with the metal layer 51 while the terminal 32 of the electronic component 30 is not coplanar with the metal layer 52.

In some embodiments, the second portion of the substrate structure 2 located at the vertical projection direction of the electronic component 30 in not symmetric with respect to the horizontal central axis of the electronic component 30. In some embodiments, the upper surface of the terminal 32 may be lower than the upper surface of the metal layer 52. In other embodiments, In this embodiment, a distance between the surface 30b and the surface 1b is not equal to a distance between the surface 30a and the surface 1a. The via connecting the terminal 32 of the electronic component 30 and the metal layer 62 has a greater depth than the via connecting the terminal 31 of the electronic component 30 and the metal layer 61.

Figure 3:
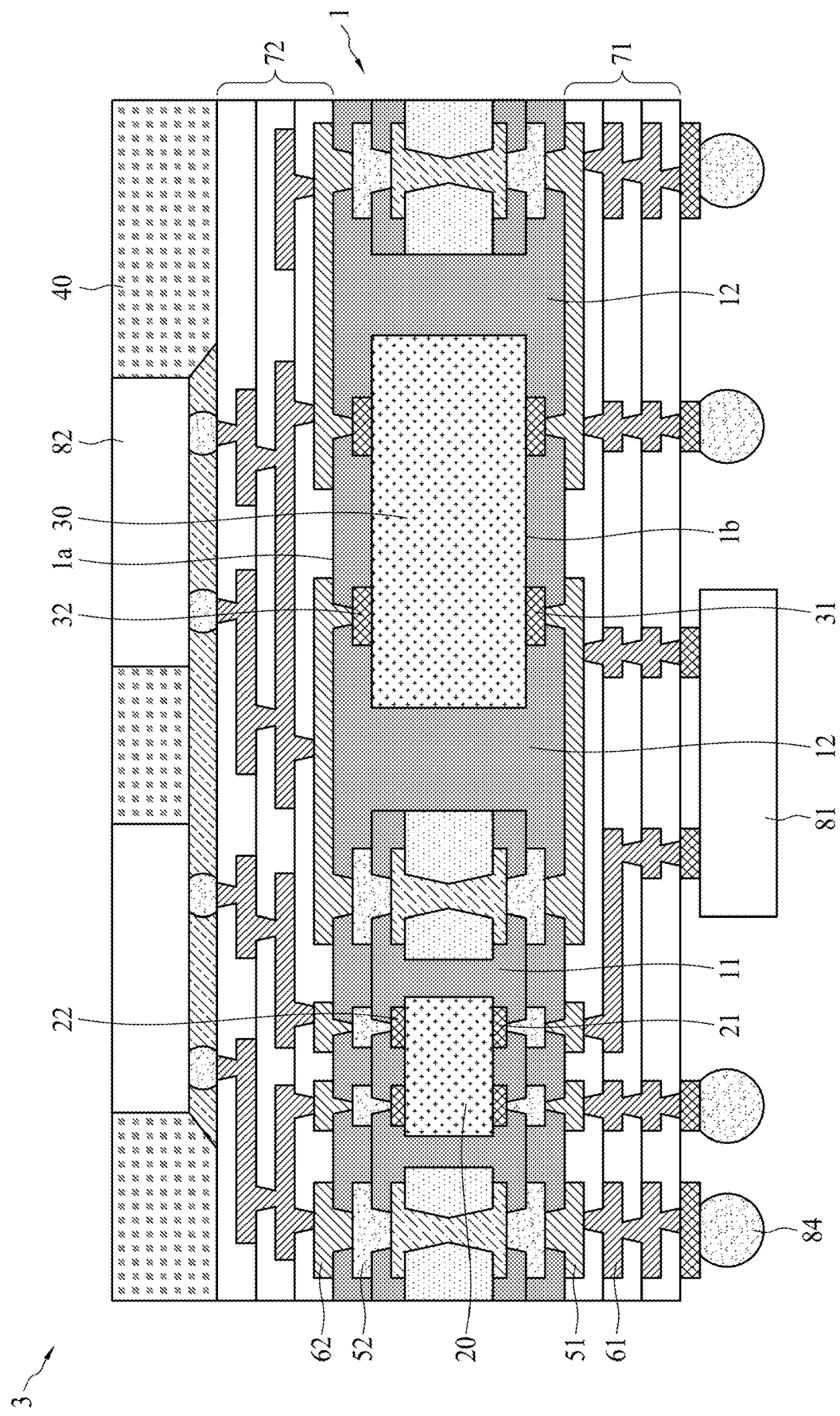
FIG. 3 illustrates a cross-sectional view of an example of a semiconductor package structure according to some embodiments of the present disclosure.

FIG. 3 illustrates a cross-sectional view of an example of a semiconductor package structure 3 according to some embodiments of the present disclosure.

The semiconductor package structure 3 may include a substrate structure 1, an encapsulant 40, a redistribution structure 71, a redistribution structure 72, a semiconductor die 81, a semiconductor die 82 and solder balls or bumps 84. Since the electronic components 20 and 30 are embedded in the substrate structure 1, the size of the semiconductor package structure can be reduced and the conductive path may be reduced.

The redistribution structure 71 and the redistribution structure 72 may be disposed on two opposite sides of the substrate structure 1. The redistribution structure 71 may be disposed on the lower surface 1b of the substrate structure 1. The redistribution structure 72 is disposed on the upper surface 1a of the substrate structure 1. The redistribution structure 71 and the redistribution structure 72 may include multiple metal layers, vias and dielectric layers, respectively.

The semiconductor die 81 may be disposed on the redistribution structure 71. The semiconductor die 81 may be electrically connected to the electronic component 20 and/or the electronic component 30 via the redistribution structure 71. In some embodiments, the semiconductor die 81 may be, for example, a power management IC (PMIC) or other chip. The semiconductor die 82 may be disposed on the redistribution structure 72. The semiconductor die 82 may be electrically connected to the electronic component 20 and/or the electronic component 30 via the redistribution structure 72. The semiconductor die 82 may be, for example, an application specific integrated circuit (ASIC) or a high bandwidth memory (HBM).

The encapsulant 40 may be disposed on the redistribution structure 72. The encapsulant 40 may cover the redistribution structure 72. The encapsulant 40 may cover the semiconductor die 82. The encapsulant 40 may surround or enclose the semiconductor die 82. In some embodiments, the encapsulant 40 is made of molding material that may include, for example, a Novolac-based resin, an epoxy-based resin, a silicone-based resin, or other another suitable encapsulant. Suitable fillers may also be included, such as powdered $SiO_2$.

The solder balls or bumps 84 may be disposed on the redistribution structure 71. The solder balls or bumps 84 may be adjacent to the surface 1b of the substrate 10. The solder balls or bumps 84 may surround the semiconductor die 81. The solder balls or bumps 84 may include, for example, AgSn, another conductive metal, or an alloy thereof. The solder balls or bumps 84 may be attached to, for example, a printed circuit board (not shown).

In this embodiment, the substrate structure 1 may be applied to a semiconductor package structure 3. Therefore, the impedance matching of the semiconductor package structure 3 may be improved. In addition, the yield for manufacturing the semiconductor package structure 3 may be enhanced.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M illustrate various stages of an example of a method for manufacturing a substrate structure according to some embodiments of the present disclosure.

Figure 4A:
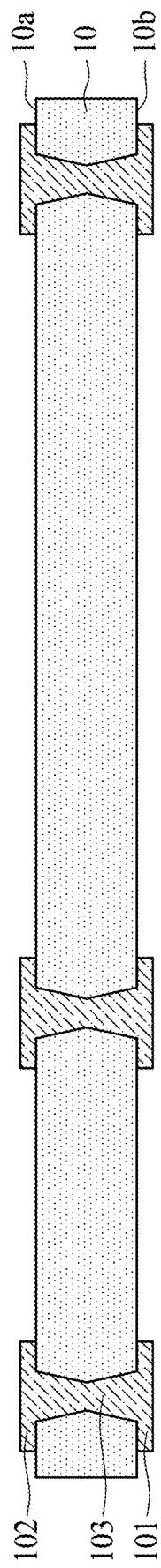

As shown in FIG. 4A, a core substrate 10 is provided. The pads 101 and 102 are formed in the lower surface 10b and the upper surface 10a of the core substrate 10, and the conductive via 103 connecting the pads 101 and 102 are also formed.

Figure 4B:
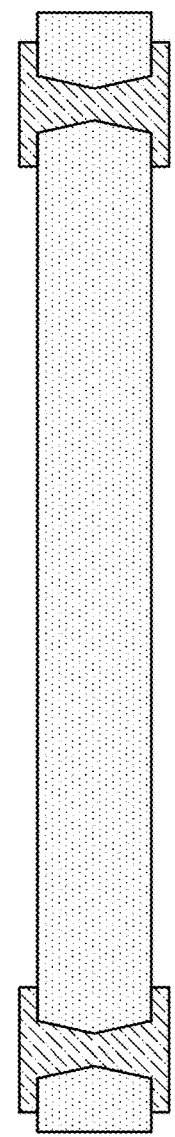
Figure 4B:
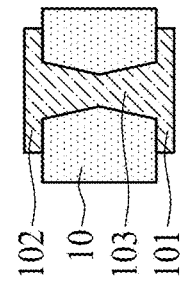

As shown in FIG. 4B, a cavity C1 is formed. The cavity C1 may be formed by, for example, an etching process, laser drilling or other suitable technique. The cavity C1 may penetrate the core substrate 10.

Figure 4C:
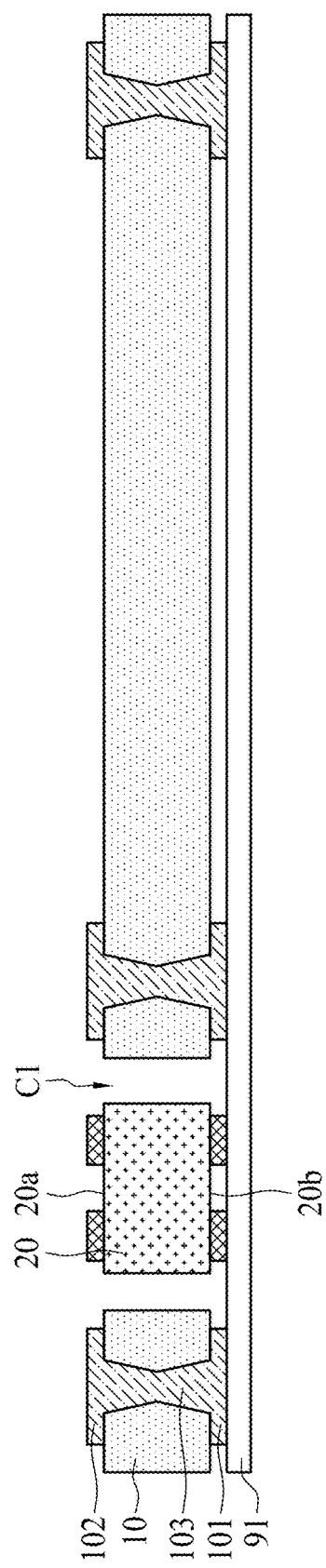

As shown in FIG. 4C, the core substrate 10 is disposed on a carrier 91. In some embodiments, the core substrate 10 may be attached to a carrier 91 through an adhesive layer (not shown). An electronic component 20 is disposed in the cavity C1. The electronic component 20 may have terminals 21 and 22 disposed on its lower and upper surfaces thereof (i.e., 20b and 20a). In some embodiment, the thickness of the core substrate 10 may be adjusted so that the thickness of the electronic component 20 is greater than, substantially equal to, or less than the thickness of the core substrate 10. In some embodiments, the lower surface of the pad 101 of the core substrate 10 may be coplanar with the lower surface of the terminal 21 of the electronic component 20.

Figure 4D:
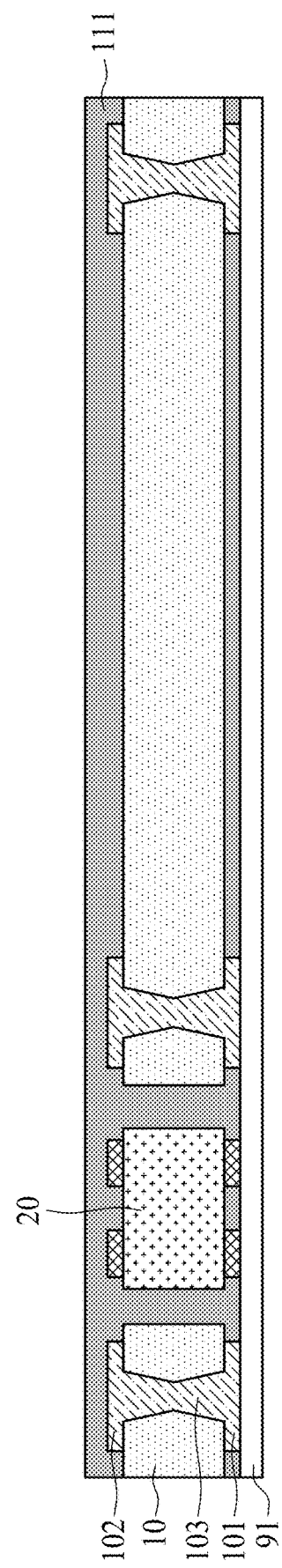

As shown in FIG. 4D, a dielectric layer 111 is formed. The dielectric layer 111 may cover the electronic component 20. The dielectric layer 111 may cover the core substrate 10. The dielectric layer 111 may be formed, for example, by applying a dielectric coating composition and/or laminating a dielectric layer (e.g., a PP or ABF layer) to the upper surface of the core substrate. The dielectric layer 111 may fill the cavity C1, for example, during coating or lamination. The dielectric layer 111 may be formed by any other suitable processes.

Figure 4E:
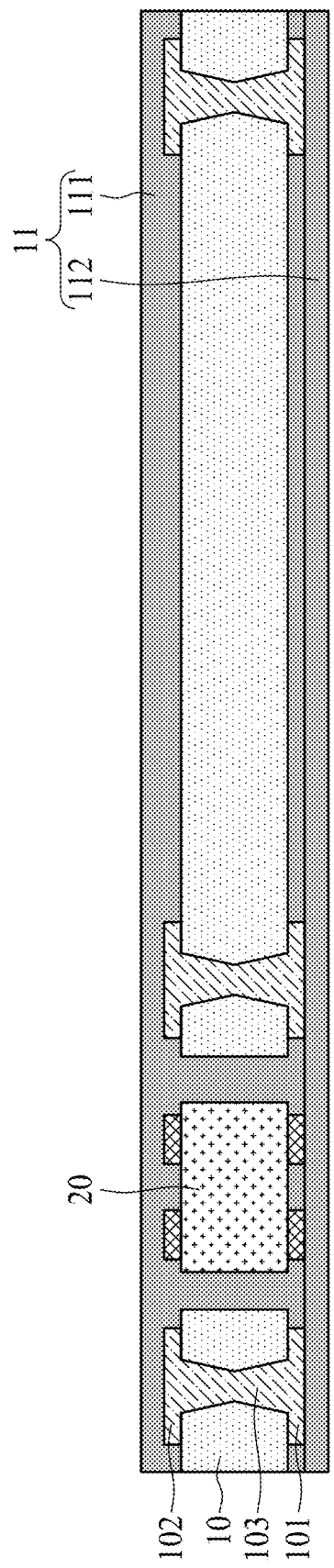

As shown in FIG. 4E, after the removal of the carrier 91 and the adhesive layer thereon, a dielectric layer 112 is formed, for example, by coating applying a dielectric coating composition and/or laminating a dielectric layer (e.g., a PP or ABF layer) to the lower surface of the dielectric layer 111. The dielectric layer 111, together with the dielectric layer 112, constitutes a dielectric layer 11 which encloses the core substrate 13 and the electronic component 20. The dielectric layer 111 and the dielectric layer 112 may be made of the same or different materials.

The dielectric layer 11 may be prepared as illustrated above or formed by any other suitable techniques. For example, in some embodiments, the dielectric layer 112 may be formed on the carrier 91 before the disposal of the core substrate 10 and the electronic component 20; and then the dielectric layer 111 is applied to cover the core substrate 10 and the electronic component 20. The present disclosure is not intended to be limited thereto.

Figure 4F:
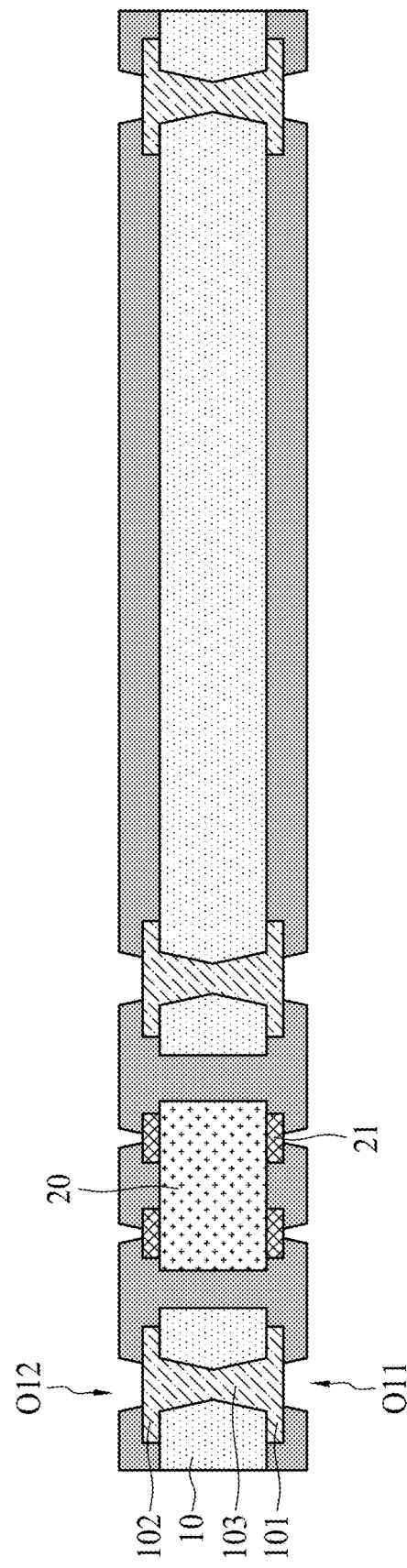

As shown in FIG. 4F, a plurality of openings O11 and O12 are formed. The openings O11 may expose the pad 101 of the core substrate 10. The openings O11 may expose the terminal 21 of the electronic component 20. The openings O12 may expose the pad 102 of the core substrate 10. The openings O12 may expose the terminal 22 of the electronic component 20. The aperture of the openings O11 and/or O12 may be modified according to the requirements of the design. The openings O11 and O12 may be formed by laser drilling, a lithography process, an etching process or other suitable processes.

Figure 4G:
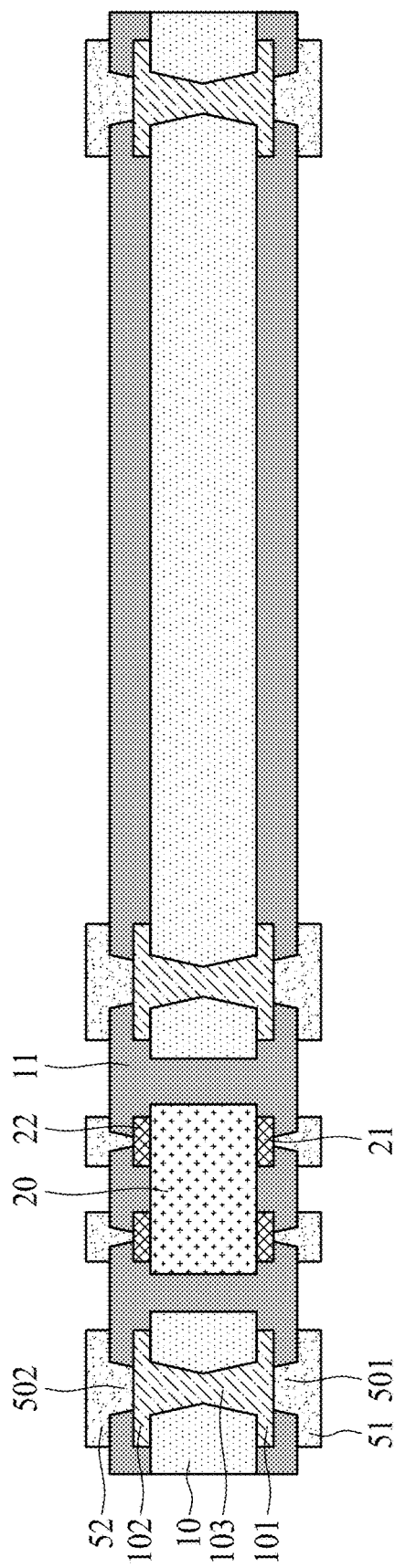

As shown in FIG. 4G, a first electroplating process may be performed to form the via 501, the metal layer 51, the via 502 and the metal layer 52. The via 501 may fill the openings O11. The via 502 may fill the openings O12. The metal layer 51 may cover the lower surface of the dielectric layer 11. The metal layer 52 may cover the upper surface of the dielectric layer 11. In other some embodiments, the metal layer 52 may be used to electrically connect the pad 102 and the terminal 22.

Figure 4H:
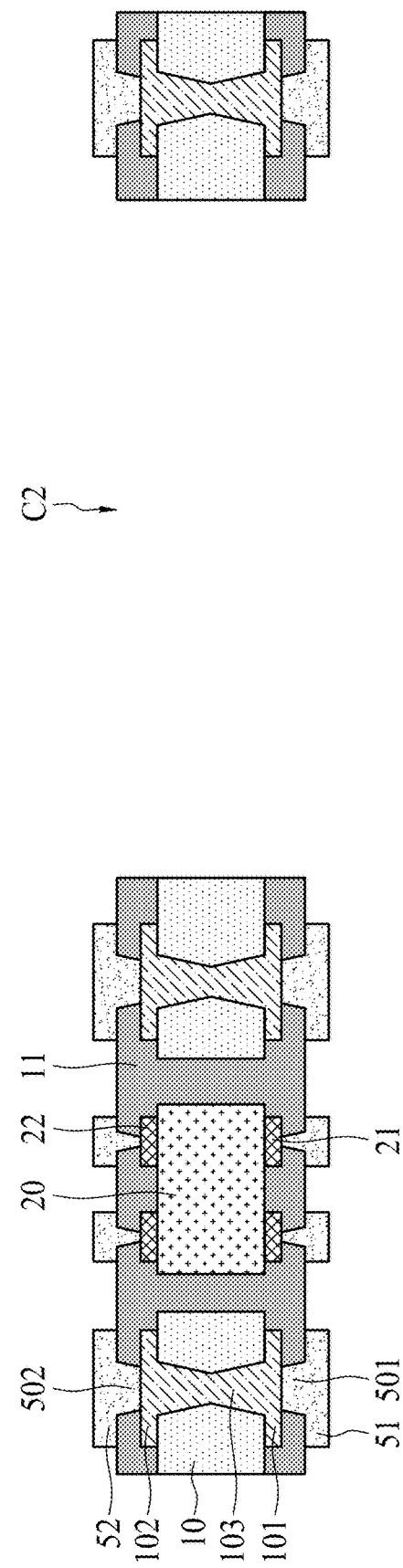

As shown in FIG. 4H, a cavity C2 is formed in the structure of FIG. 4G. In some embodiments, the aperture of the cavity C2 is greater than that of the cavity C1. The cavity C2 may be formed by, for example, an etching process, laser drilling or other suitable technique. The cavity C2 may penetrate the dielectric layer 11 and the core substrate 13.

As shown in FIG. 4I, the structure of FIG. 4H is disposed on a carrier 92. In some embodiments, the structure of FIG. 4H may be attached to a carrier 92 through an adhesive layer (not shown). An electronic component 30 is disposed in the cavity C2. The electronic component 30 may have terminals 31 and 32 disposed on its lower and upper surfaces thereof (i.e., 30b and 30a). The electronic component 30 has a thickness greater than that of the electronic component 20. In some embodiments, the metal layer 51 may be coplanar with the terminal 31 of the electronic component 30 since both are disposed on the carrier 92. More specifically, the lower surface of the metal layer 51 may be coplanar with the lower surface of the terminal 31 of the electronic component 30. In some embodiments, the thickness of the metal layer 52 may be controlled such that the metal layer 502 and the terminal 32 are at a same height; and if necessary, the thickness of the metal 51 and the thickness of the dielectric layer 11 may be adjusted together with the thickness of the metal layer 52 to achieve such purpose.

As shown in FIG. 4J, a dielectric layer 121 is formed. The dielectric layer 121 may cover the electronic component 30, the dielectric layer 12, and the metal layer 52. The dielectric layer 12 may be formed, for example, by applying a dielectric coating composition and/or laminating a dielectric layer (e.g., a PP or ABF layer) to the upper surface of the structure of FIG. 4I. The dielectric layer 121 may fill the cavity C2, for example, during coating or lamination. The dielectric layer 121 may be formed by any other suitable processes.

Figure 4K:
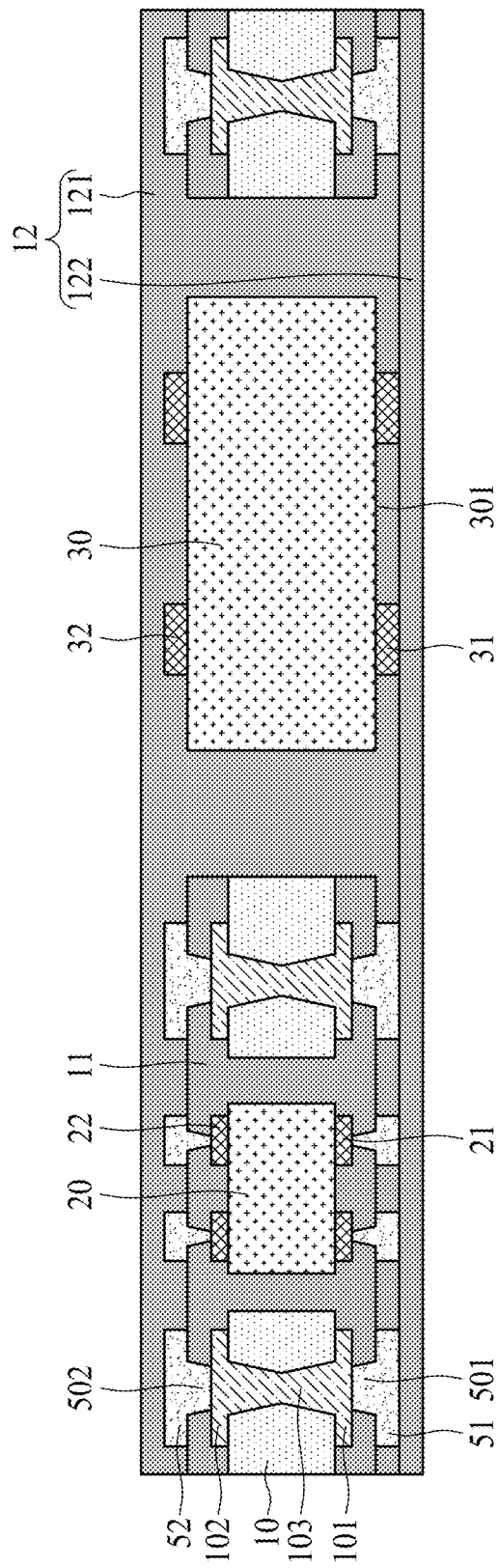

As shown in FIG. 4K, after the removal of the carrier 91 and the adhesive layer thereon a dielectric layer 122 is formed, for example, by coating applying a dielectric coating composition and/or laminating a dielectric layer (e.g., a PP or ABF layer) to the lower surface of the dielectric layer 121. The dielectric layer 121, together with the dielectric layer 122, constitutes a dielectric layer 12 which encloses the electronic component 30, the dielectric layer 12, and metal layers 52 and 51. The dielectric layer 121 and the dielectric layer 122 may be made of the same or different materials.

Similar to the dielectric layer 11, the dielectric layer 12 may be formed by any other suitable techniques. For example, in some embodiments, the dielectric layer 122 may be formed on the carrier 92 before the disposal of the structure of FIG. 4H and the electronic component 30; and then the dielectric layer 121 is applied.

Figure 4L:
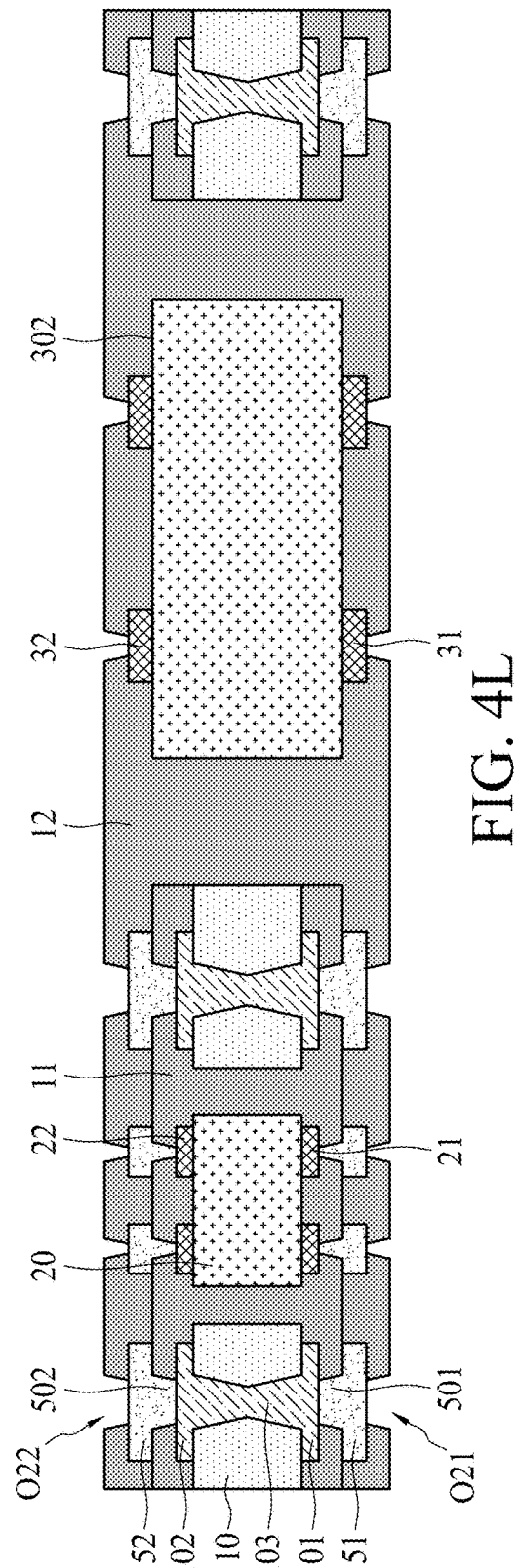

As shown in FIG. 4L, a plurality of openings O21 and O22 are formed. The openings O21 may expose the metal layer 51. The openings O21 may expose the terminal 31 of the electronic component 30. The openings O22 may expose the metal layer 52. The openings O22 may expose the terminal 32 of the electronic component 30. The aperture of the openings O21 and 22 may be modified according to the requirements of the design. The openings O21 and O22 may be formed by laser drilling, a lithography process, an etching process or other suitable processes.

Figure 4M:
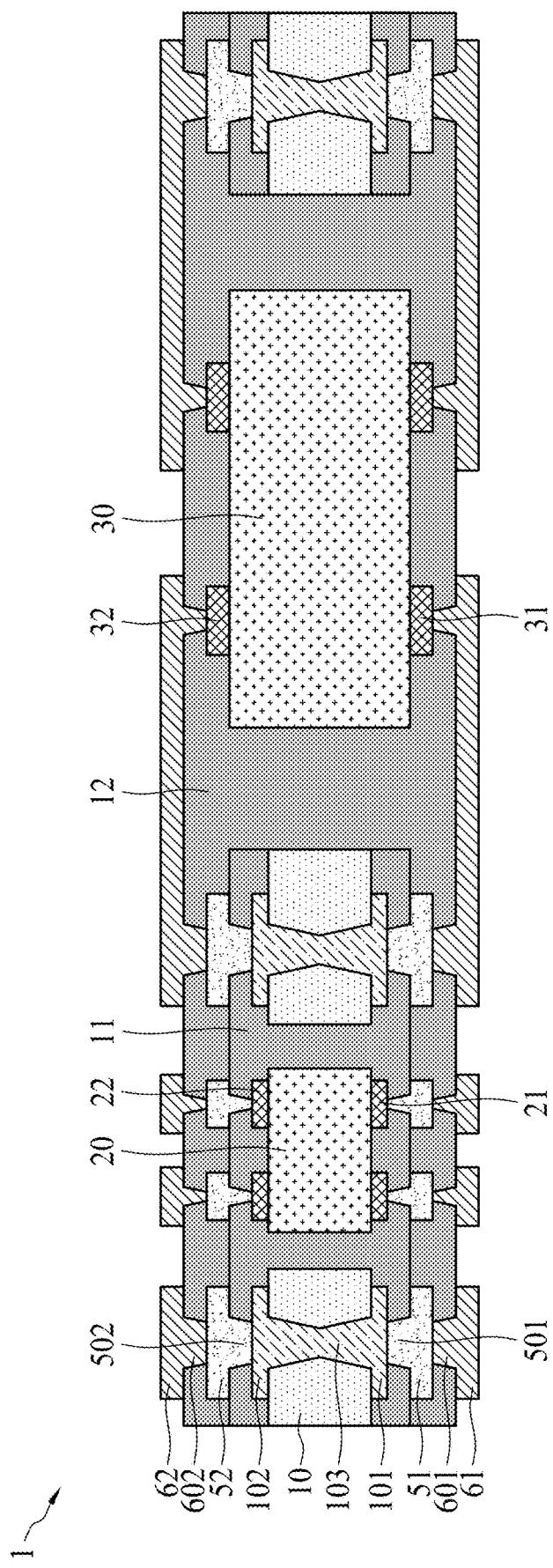

As shown in FIG. 4M, a second electroplating process may be performed to form the via 601, the metal layer 61, the via 602 and the metal layer 62, thereby producing the substrate structure 1. The via 601 may fill the openings O21. The via 602 may fill the openings O22. The metal layer 61 may cover the lower surface of the dielectric layer 12. The metal layer 62 may cover the upper surface of the dielectric layer 12. In this embodiment, since the aperture of the openings O21 is substantially the same as that of the openings O22, the vias 601 and 602 may be formed in the openings O21 and O22, respectively, with fewer defects, such as voids. In other some embodiments, the metal layer 62 may be used to electrically connect the pad 102, the terminal 22 and the terminal 32.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:
1. A substrate structure, comprising:
a substrate;
a first electronic component disposed within the substrate;
a second electronic component disposed within the substrate, wherein a first vertical dimension of the first electronic component is different from a second vertical dimension of the second electronic component, and a horizontal central axis of the first electronic component is substantially aligned with a horizontal central axis of the second electronic component;

a first via electrically connected to the first electronic component and disposed within a first opening of the substrate which is recessed from an upper surface of the substrate; and a second via electrically connected to the second electronic component and disposed within a second opening of the substrate which is recessed from the upper surface of the substrate, wherein a third vertical dimension of the first via is different from a fourth vertical dimension of the second via, wherein the fourth vertical dimension is greater than the third vertical dimension, and a level of an upper surface of the second electronic component is higher than a level of an upper surface of the first electronic component.

2. The substrate structure of claim 1, further comprising:
a build-up layer between the first via and the first electronic component,
wherein the build-up layer laterally overlaps the second via.

3. The substrate structure of claim 1, further comprising:
a patterned metal layer over the upper surface of the substrate and in contact with the first via and the second via,
wherein a level of a lower surface of the second via is lower than a level of a lower surface of the first via.

4. The substrate structure of claim 1, further comprising:
a dielectric layer encapsulating the first electronic component and the second electronic component,
wherein a fifth vertical dimension of an interface between the dielectric layer and the first via is different from a sixth vertical dimension of an interface between the dielectric layer and the second via.

5. The substrate structure of claim 1, wherein the substrate structure has a first portion located at a vertical projection direction of the first electronic component, and the first portion of the substrate structure is symmetric with respect to the horizontal central axis of the first electronic component.

6. The substrate structure of claim 5, wherein the substrate structure has a second portion located at a vertical projection direction of the second electronic component, and the second portion of the substrate structure is symmetric with respect to the horizontal central axis of the second electronic component.

* * * * *